(12) United States Patent
Kim et al.

(10) Patent No.: US 12,009,458 B2
(45) Date of Patent: Jun. 11, 2024

(54) DISPLAY PANEL WITH PROTECTION LAYER TO PROTECT AGAINST RADIANT ENERGY

(71) Applicant: SAMSUNG ELECTRONICS CO., LTD., Suwon-si (KR)

(72) Inventors: Sungki Kim, Suwon-si (KR); Jeongroh Lee, Suwon-si (KR); Hyunjun Jung, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 732 days.

(21) Appl. No.: 16/973,118

(22) PCT Filed: Dec. 7, 2018

(86) PCT No.: PCT/KR2018/015489
§ 371 (c)(1),
(2) Date: Dec. 8, 2020

(87) PCT Pub. No.: WO2019/235703
PCT Pub. Date: Dec. 12, 2019

(65) Prior Publication Data
US 2021/0257516 A1   Aug. 19, 2021

(30) Foreign Application Priority Data

Jun. 8, 2018  (KR) .................. 10-2018-0066121

(51) Int. Cl.
*H01L 33/44* (2010.01)
*H01L 33/00* (2010.01)
(Continued)

(52) U.S. Cl.
CPC ............ *H01L 33/44* (2013.01); *H01L 33/005* (2013.01); *H01L 33/56* (2013.01); *H01L 33/58* (2013.01);
(Continued)

(58) Field of Classification Search
CPC ....... H01L 33/44; H01L 33/005; H01L 33/56; H01L 33/58
(Continued)

(56) References Cited

U.S. PATENT DOCUMENTS 7,400,003 B2 * 7/2008 Lee .................. H01L 27/14687
257/292
7,709,092 B2   5/2010 Qiu et al.
(Continued)

FOREIGN PATENT DOCUMENTS

CN  106229401 A * 12/2016 ............ H01L 33/48
CN  207637833 U *  7/2018 ............ H01L 33/10
(Continued)

OTHER PUBLICATIONS

International Search Report for corresponding PCT/KR2018/015489, issued March 14, 2019.
(Continued)

*Primary Examiner* — Phuc T Dang
(74) *Attorney, Agent, or Firm* — STAAS & HALSEY LLP

(57) ABSTRACT

Disclosed is a display panel. The display panel comprises: a light-emitting device; a first protection layer disposed on the light-emitting device and having an anti-glare-treated surface; a second protection layer disposed on the first protection layer and having a surface having been subjected to at least one of an anti-glare treating and an anti-reflection treating; and a transparent layer containing a transparent material that allows visible lights to penetrate there through and absorbs or reflects ultraviolet rays and infrared rays.

12 Claims, 11 Drawing Sheets

(51) Int. Cl.
*H01L 33/56* (2010.01)
*H01L 33/58* (2010.01)

(52) U.S. Cl.
CPC ................ *H01L 2933/0025* (2013.01); *H01L 2933/0091* (2013.01)

(58) Field of Classification Search
USPC .......................................................... 257/79
See application file for complete search history.

(56) References Cited

U.S. PATENT DOCUMENTS

| | | | |
|---|---|---|---|
| 9,976,041 B2 | 5/2018 | Fu et al. | |
| 2006/0286381 A1 | 12/2006 | Naito et al. | |
| 2013/0299789 A1* | 11/2013 | Yamazaki | H10K 59/131 257/40 |
| 2016/0370505 A1 | 12/2016 | Koo et al. | |

FOREIGN PATENT DOCUMENTS

| | | | | |
|---|---|---|---|---|
| JP | H09113705 A | 5/1997 | | |
| JP | 2005243509 A | 9/2005 | | |
| JP | 2008-231367 A | 10/2008 | | |
| JP | 4230046 B2 | 2/2009 | | |
| JP | 2009204577 A | 9/2009 | | |
| JP | 5238370 B2 | 7/2013 | | |
| JP | 5687231 B2 | 3/2015 | | |
| JP | 6343878 B2 * | 6/2018 | | |
| KR | 10-2006-0132555 | 12/2006 | | |
| KR | 20080036804 A | 4/2008 | | |
| KR | 20120047638 A * | 5/2012 | ............... G02B 1/14 |
| KR | 101438687 B1 | 9/2014 | | |
| KR | 20160149847 A | 12/2016 | | |
| KR | 101796913 B1 | 11/2017 | | |
| WO | 2005022212 A1 | 3/2005 | | |
| WO | WO-2015/011590 A * | 1/2015 | ............. H01L 33/56 |

OTHER PUBLICATIONS

Written Opinion of the ISA for corresponding PCT/KR2018/015489, issued Mar. 14, 2019.
Korean Office Action dated Aug. 19, 2022 for Korean Application No. 10-2018-0066121.
European Office Action dated Jan. 16, 2023 for European Patent Application No. 18921999.1.
Extended European Search Report dated Jun. 24, 2021 from European Application No. 18921999.1.

* cited by examiner (a)

(b)

DISPLAY PANEL WITH PROTECTION LAYER TO PROTECT AGAINST RADIANT ENERGY

CROSS-REFERENCE TO RELATED APPLICATIONS

This application is a U.S. National Stage Application which claims the benefit under 35 U.S.C. § 371 of International Patent Application No. PCT/KR2018/015489, filed on Dec. 7, 2018, which claims foreign priority benefit under 35 U.S.C. § 119 of Korean Patent Application No. 10-2018-0066121, filed on Jun. 8, 2018, in the Korean Intellectual Property Office, the contents of both of which are incorporated herein by reference.

TECHNICAL FIELD

Aspects of the example embodiments relate generally to a display panel and a method for manufacturing thereof and, more particularly, to a display panel including a protection layer and a method for manufacturing thereof.

BACKGROUND ART

Currently, radiant energy can be emitted by the heat generated in the light emitting element (for example, LED) inside the display panel. As shown in FIG. 1, harmful radiant energy (radiant energy of infrared rays and ultraviolet wavelength band) is emitted on the surface of the display panel in addition to visible rays due to the temperature rise of the light emitting device. In this case, infrared rays and ultraviolet rays may be emitted to the user space on the front surface of the display panel. As described above, the emitted ultraviolet rays cause discoloration of an object or damage to the skin, and infrared rays are converted into heat upon irradiation of the human skin, resulting in discomfort of the consumer and discoloration of the object, if viewing distance is short.

Further, in the case of an LED display or the like without an LCD panel, since a separate protection layer is not provided in the LED light emitting device, the light emitting device may be damaged by external contact, or when a part of the body is in contact with the light emitting device, there is a danger of skin burn.

DISCLOSURE

Technical Problem

An aspect of the example embodiments relates to a display panel having a protection layer for protecting a user from radiant energy generated in a light emitting device and protecting the light emitting device from external contact, and a method of manufacturing the same.

Technical Solution

According to an exemplary embodiment, a display panel includes a light emitting device; a first protection layer which is disposed on an upper portion of the light emitting device, and surface is treated with diffuse reflection; a second protection layer which is disposed on an upper portion of the first protection layer, and surface is treated with at least one of diffuse reflection or anti-reflection; and a transparent layer which includes transparent materials that transmit visible rays, and absorb or reflect ultraviolet rays and infrared rays.

The transparent layer may be disposed between the first protection layer and the second protection layer and the transparent materials may be spaced from each other with a predetermined interval.

The transparent layer is a film layer in which the transparent materials are wet-coated.

The transparent materials may be mixed with at least one of the first protection layer and the second protection layer.

The thermal conductivity of the first protection layer may be greater than or equal to a predetermined value, and thermal conductivity of the second protection layer may be less than the predetermined value.

The transparent materials may be fixed to a surface of the first protection layer which is treated with the diffuse reflection.

The first protection layer may have hardness which is less than a predetermined value, and the second protection layer may have hardness which is greater than or equal to a predetermined value.

A surfaced of the first protection layer may be coated with a prism sheet.

A surface of the second protection layer may be coated with a hydrophilic material or a hydrophobic material.

The light emitting device may be a light emitting diode (LED).

The transparent materials may be at least one of antimony tin oxide (ATO) and indium tin oxide (ITO).

According to an exemplary embodiment, a method for manufacturing a display panel is provided. The method may include forming a first protection layer on an upper portion of a light emitting device; treating a surface of the first protection layer with diffuse reflection; disposing a transparent layer including transparent materials on an upper portion of the first protection layer treated with the diffuse reflection; forming a second protection layer on an upper portion of the transparent layer; and treating a surface of the second protection layer with at least one of diffuse reflection and anti-reflection.

The transparent materials may transmit visible rays, and absorb or reflect ultraviolet rays and infrared rays The disposing a transparent layer may include disposing the transparent materials with a predetermined interval.

The disposing a transparent layer may include disposing a film layer in which the transparent materials are wet-coated.

The thermal conductivity of the first protection layer may be greater than or equal to a predetermined value, and thermal conductivity of the second protection layer may be less than the predetermined value.

The transparent materials may be fixed to a surface of the first protection layer which is treated with the diffuse reflection.

The first protection layer may have hardness which is less than a predetermined value, and the second protection layer may have hardness which is greater than or equal to a predetermined value.

The treating a surface of the second protection layer with diffuse reflection may include coating a surface of the first protection layer with a prism sheet.

The method may further include coating a surface of the second protection layer with a hydrophilic material or a hydrophobic material.

A method for manufacturing a display panel may include forming a first protection layer on an upper portion of a light emitting device; treating a surface of the first protection layer with diffuse reflection; forming a second protection layer on an upper portion of the first protection layer; and treating a surface of the second protection layer with at least one of diffuse reflection and anti-reflection, wherein at least one of the first protection layer and the second protection layer may include transparent materials, and the transparent materials transmit visible rays, and absorb or reflect ultraviolet rays and infrared rays.

Advantageous Effects

As described above, a protection layer is provided on a front surface of a display panel to block ultraviolet rays and infrared rays emitted from the light emitting device and protect the light emitting device from external contact, according to various exemplary embodiments.

BEST MODE

Mode for Invention

Figure 1:
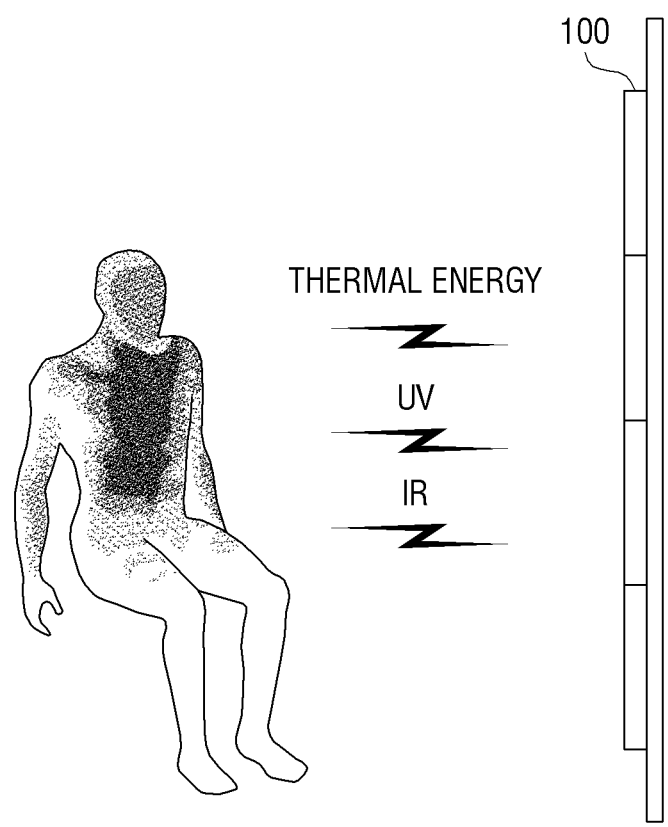
FIG. 1 is a view to describe problems of the related art.

Certain example embodiments are described in greater detail below with reference to the accompanying drawings.

First, the terms used in the Specification and claims have chosen generic terms in view of their function in various embodiments of the present disclosure. However, these terms may vary depending on the intentions, legal or technical interpretations of the artisan skilled in the art, and the emergence of new technologies. In addition, some terms may be terms arbitrarily selected by the applicant. These terms may be construed in the meaning defined herein and, unless otherwise specified, may be construed on the basis of the entire contents of this Specification and common technical knowledge in the art.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments may be practiced without those specifically defined matters. Also, well-known functions or constructions are not described in detail since they would obscure the description with unnecessary detail.

The terms such as "first," "second," and so on may be used to describe a variety of elements, but the elements should not be limited by these terms. The terms are used only for the purpose of distinguishing one element from another.

A singular expression includes a plural expression, unless otherwise specified. It is to be understood that the terms such as "comprise" or "consist of" are used herein to designate a presence of characteristic, number, step, operation, element, component, or a combination thereof, and not to preclude a presence or a possibility of adding one or more of other characteristics, numbers, steps, operations, elements, components or a combination thereof.

In addition, the expression "at least one of a, b, and c" can be interpreted as "a," "b," "c," "a and b," "a and c," "b and c," or "a, b, and c."

Hereinbelow, certain embodiments will now be described in greater detail with reference to the accompanying drawings to enable those skilled in the art to work the same with ease. However, embodiments may be realized in a variety of different configurations, and not limited to descriptions provided herein. Further, those that are irrelevant with the description are omitted so as to describe embodiments more clearly, and similar drawing reference numerals are used for the similar elements throughout the description.

Hereinbelow, the present disclosure will be further described with reference to attached drawings.

Figure 2:
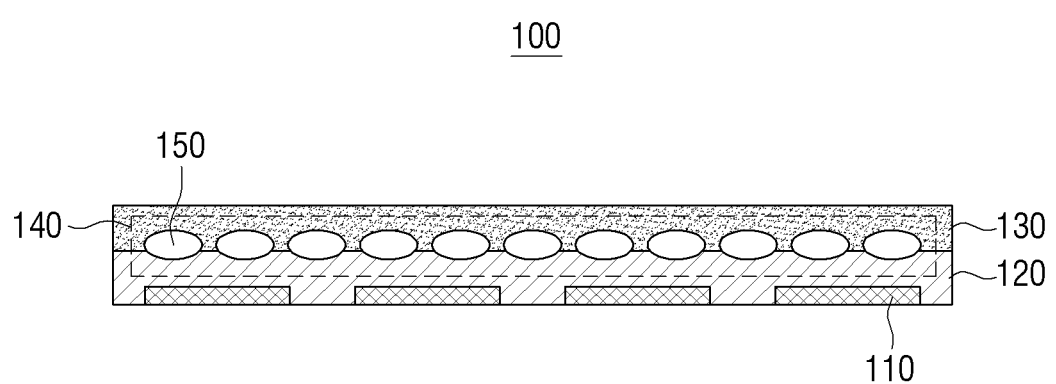
FIG. 2 is a view which illustrates a display panel according to an exemplary embodiment.

FIG. 2 is a view which illustrates a display panel according to an exemplary embodiment.

According to FIG. 2, a display panel 100 includes a light emitting device 110, a first protection layer 120, a second protection layer 130, and a transparent layer 140.

The display panel 100 performs a function to visualize a video signal and display a video.

The light emitting device 110 is an element that converts electricity into light, and may be implemented as a light emitting diode (LED). However, the present disclosure is not limited thereto, and the light emitting device may be implemented as a semiconductor laser diode, a solid laser, an organic light emitting diode, or the like.

Meanwhile, a light emitting diode (LED) is an element that generates light by using a light emitting phenomenon (electroluminescence) generated when a voltage is applied to a semiconductor. As the material of the LED, materials that satisfy the conditions such that the light emitting wavelength exists in the visible light area or the near infrared area, the light emitting efficiency is high, and the P-N junction can be manufactured can be used. For example, a semiconductor made of compounds such as gallium nitride (GaN), gallium arsenide (GaAs), gallium phosphide (GaP), gallium-arsenic-phosphorous (GaAs1-xPx), indium phosphide (InP), and indium-gallium-phosphorus (In1-xGaxP) can be used as materials for LEDs.

The first protection layer 120 can be disposed at an upper portion of the light emitting device 110.

According to one embodiment, the first protection layer 120 may be formed to fill a space between the light emitting devices 110 spaced apart at a predetermined interval and cover the surface of the light emitting device 110. Since the first protection layer 120 covers the surface of the light emitting device 110, the first protection layer 120 may perform a waterproof and dustproof function for the light emitting device 110.

According to another embodiment, the first protection layer 120 fills only a space between the light emitting devices 110 spaced apart at a predetermined interval, and may not cover the surface of the light emitting device 110 in the front direction of the display panel 100.

Meanwhile, the surface of the first protection layer 120 may be an anti-glare treated layer. The first protection layer 120 may be diffusely reflected so that transparent materials 150 to be described later is stably disposed on the diffusely reflecting surface and the internal structure of the display panel 100 may not be visually recognized outside the display panel 100.

The second protection layer 130 may be disposed on the upper side of the first protection layer 120. The surface of the second protection layer 130 may be a layer treated with at least one of diffuse reflection and anti-reflection. Accordingly, it is possible to reduce the user's glare due to the reflection of the external light reflected from the outside to the display panel 100. A film that performs diffuse reflection or anti-reflection function may be coded on the surface of the second protection layer 130.

Here, the first protection layer 120 and the second protection layer 130 may be transparent materials which have a shape of a film or a solid (for example, glass).

The first protection layer 120 may absorb a shock to protect the light emitting device 110 and may be a silicone material that exhibits less yellowing phenomenon that changes color over time and does not cause result in brightness decline. For example, an Ethylene-Vinyl Acetate Copolymer (EVA) material may be used for the first protection layer 120.

The protection layer 130 may be a rigid material having a small influence of external scratches. For example, the second protection layer 130 may be made of polyethylene terephthalate (PET). However, the first protection layer 120 and the second protection layer 130 are not limited to these materials.

According to an exemplary embodiment, the transparent layer 140 may be disposed between the first protection layer 120 and the second protection layer 130. The transparent layer 140 may include the transparent materials 150 that are disposed apart from each other at a predetermined interval.

Here, the transparent materials 150 may transmit visible rays and block ultraviolet rays and infrared rays. Specifically, the transparent materials 150 may be a material that absorbs or reflects ultraviolet rays and infrared rays. Here, the visible rays, ultraviolet rays, and the infrared rays may be emitted from the light emitted from the outside of the display panel 100 as well as emitted from the light emitting device 110.

For example, the transparent materials may be at least one of antimony tin oxide (ATO) or indium tin oxide (ITO) or is not limited thereto.

According to another embodiment, the transparent layer 140 may be in the form of a film coated with transparent materials 150. For example, the transparent layer 140 may be a film layer wet coated with a component such as ATO or ITO. The transparent layer 140 in the form of a film may be disposed on the upper portion of the light emitting device 110, the upper portion of the first protection layer 120, or the upper portion of the second protection layer 130.

According to still another embodiment, the transparent materials 150 may be mixed with at least one of the first protection layer 120 and the second protection layer 130. That is, at least one of the first protection layer 120 and the second protection layer 130 may include the transparent materials 150. Here, the transparent materials 150 are inserted into at least one of the first protection layer 120 and the second protection layer 130 in a liquid state dissolved in the organic solution and be mixed with the first protection layer 120 and the second protection layer 120.

According to still another exemplary embodiment, the transparent layer 140 may be disposed inside the first protection layer 120 or the second protection layer 130.

According to still another embodiment, the transparent layer 140 may be a UV reflective coating layer that transmits visible rays and reflects ultraviolet rays. Alternatively, the transparent layer 140 may be a white phosphor coating layer that transmits visible rays and converts ultraviolet rays to visible rays and transmits the visible rays.

According to another embodiment, when a triacetyl-cellulose (TAC) film is used for at least one of the first protection layer 120 and the second protection layer 130, the transparent layer 140 may not be provided. When a protection layer is formed using a TAC film, even if there is no transparent material 150 formed of at least one of ATO (Antimony Tin Oxide (ATO) and Indium Tin Oxide (ITO), ultraviolet rays and infrared rays can be blocked.

In the meantime, the transparent materials 150 may be fixed to the surface of the first protection layer 120, which is diffusely reflected. Specifically, the transparent materials 150 can be stably fixed on the surface of the first protection layer 120 because the surface of the first protection layer 120 is diffusely reflected, resulting in a wider surface area.

Further, since the surface of the first protection layer 120 is diffusely refracted, visible rays emitted from the outside cannot reach a user, and consequently, the structure inside the display panel may not be visible to the outside.

According to another embodiment, the transparent materials 150 may be fixed to the surface of the first protection layer 120 by an adhesive. For example, the adhesive may be a pressure sensitive adhesive (PSA) that bonds two objects with a small pressure. Alternatively, the adhesive may be a color PSA with added optical function, such as absorbing infrared rays in addition to simple adhesive function.

The thermal conductivity of the first protection layer 120 may be greater than or equal to the predetermined value, and the thermal conductivity of the second protection layer 130 may be less than the predetermined value.

The first protection layer 120 may be formed as a layer contacting the light emitting device 110 and having a relatively high thermal conductivity, and by diffusing the thermal energy emitted from the light emitting device 110 to left or right side instead of the front side of the display panel 100 and reduce thermal energy directly transmitted to a user.

The second protection layer 130 is an outermost layer that is exposed to the outside, and may be a layer having a relatively low thermal conductivity so that a low-temperature burn or the like does not occur during user's contact. For example, the thermal conductivity of the second protection layer 130 may be adjusted by adding a filler to the second protection layer 130.

The first protection layer 120 may be less than a predetermined hardness and the second protection layer 130 may be greater than or equal to a predetermined hardness. Here, the predetermined hardness may be HB 4.

The first protection layer 120 contacting the light emitting device 110 may have a relatively low hardness to protect the light emitting device 110 from external impact. When the first protection layer 120 is made of a material with high hardness, the light emitting device 110 may be damaged because of low elasticity in an external impact. Accordingly, when the first protection layer 120 has a relatively low hardness so that an external impact is applied to the display panel 100, the first protection layer 120 is elastically deformed to cover all or a part of the external impact, thereby absorbing the impact to the light emitting device 110.

The second protection layer 130, which is the outermost protection layer, may have a relatively high hardness in order to prevent external scratches and damage to the display panel 100.

In the meantime, various functional sheets can be used for the surface of the first protection layer 120. Specifically, various functional sheets may be coated on the surface of the first protection layer 120.

For example, as the functional sheet, various optical films such as a diffusion sheet, a prism sheet, and a Dual Brightness Enhancement Film (DBFF) sheet can be used. In particular, the prism sheet can change the direction of light emitted from the light emitting device 110 to the front surface of the display panel 100, thereby enhancing the straightness of light emitted from the light emitting device 110.

The surface of the second protection layer 130 may be coated with a hydrophilic material or a hydrophobic material. Depending on the use environment of the display panel, the surface of the second protection layer 130 may be made of a hydrophilic material or a hydrophobic material. The surface of the second protection layer 130 is coated with a hydrophilic material or a hydrophobic material to prevent external contamination and prevent the visibility decline of the surface of the display panel 100 due to dew condensation on the surface of the display panel 100 and so on.

According to another embodiment of the present disclosure, the transparent layer 140 including the first protection layer 120, the second protection layer 130, and the transparent materials 150 can be separated from the light emitting device 110 and disposed at another layer.

An outer protection layer (not shown) formed of a glass substrate may be disposed on the outermost portion of the display panel 100 and the first protection layer 120, the second protection layer 130, and the transparent layer 140 may be included in the outer protection layer (not shown). That is, the outer protection layer (not shown) may be disposed on the upper portion of the layer including the light emitting device 110.

For example, in the case of a display for an outdoor display panel, a separate outer protection layer (not shown) which includes the first protection layer 120, the second protection layer 130, and the transparent layer 140 can be formed on the outermost portion of the display panel 100, spaced apart from the light emitting device 110. However, the material of the outer protection layer (not shown) is not limited to the glass substrate.

According to another embodiment, only the transparent layer 140 may be included in the outer protection layer (not shown). That is, an outer protection layer (not shown) formed of a glass substrate may be disposed on the second protection layer 130, and the transparent layer 140 may be included in the outer protection layer (not shown). Here, the outer protection layer (not shown) may be in the form of a film coated with a wet coating of the transparent materials 150. The display panel 100 is not limited to the LED panel described above, and can be implemented as an LCD panel, a Plasma Display Panel (PDP) panel, and an Organic Light Emitting Diodes (OLED) panel.

Figure 3:
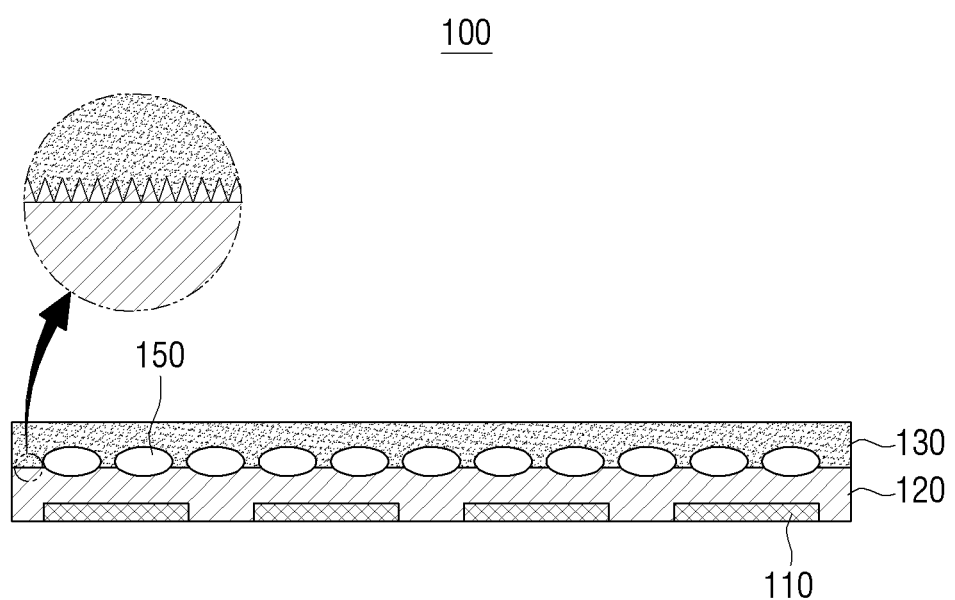
FIG. 3 is a view which illustrates diffusely reflected surface according to an exemplary embodiment.

FIG. 3 is a view which illustrates diffusely reflected surface according to an exemplary embodiment.

According to FIG. 3, the surface of the first protection layer 120 may be a diffusely-reflected layer. The surface of the first protection layer 120 is diffusely reflected to enlarge the surface area of the first protection layer 120 so that the transparent materials 150 can be stably fixed to the surface of the first protection layer 120. That is, the surface of the first protection layer 120 is diffusely reflected to increase the adhesion of the first protection layer 120.

Further, since the surface of the first protection layer 120 is diffusely reflected and the visible rays emitted from the outside cannot reach a user, and the internal structure of the display panel 100 may not be visually recognized.

According to another embodiment, the transparent materials 150 may be fixed to the surface of the first protection layer 120 by an adhesive. For example, the adhesive may be a pressure sensitive adhesive (PSA) that bonds two objects with a small pressure. Alternatively, the adhesive may be a color PSA with added optical function, such as absorbing infrared rays in addition to simple adhesive function.

Figure 4:
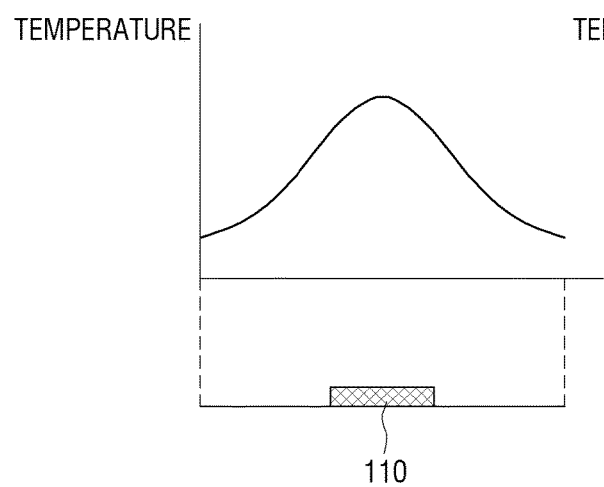
FIG. 4 is a view to describe reduction of heat emitted to a front surface of a display panel according to an exemplary embodiment.
Figure 4:
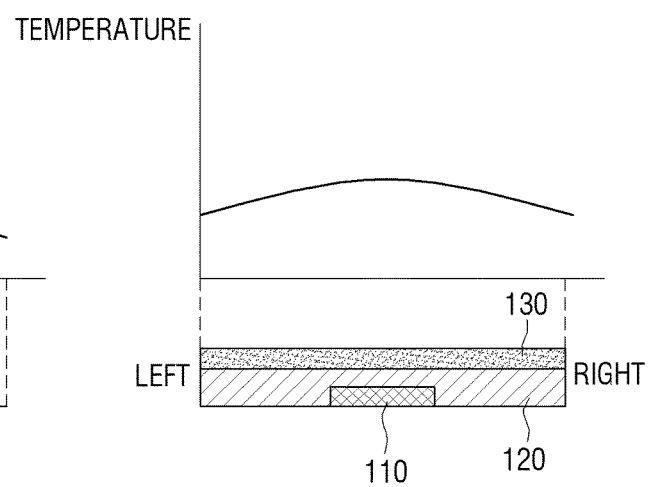

FIG. 4 is a view to describe reduction of heat emitted to a front surface of a display panel according to an exemplary embodiment.

FIG. 4A illustrates a display panel and temperature of a display panel in a state where the protection layer according to the present disclosure is not provided. In this case, as shown in FIG. 4A, the temperature can be rapidly increased at the position where the light emitting device 110 is disposed. Accordingly, when the user's body touches the display panel 100 in a state where the protection layer is not provided, burn or the like may occur.

As illustrated in FIG. 4B, when the first protection layer 120 having a predetermined thermal conductivity or more and the second protection layer 130 having a value less than a predetermined thermal conductivity are provided, heat emitted from the light emitting device 110 may spread evenly over the display panel 100.

Specifically, the heat emitted from the light emitting device 110 can be transmitted to the first protection layer 120 that is in contact with the light emitting device 110. The heat transmitted to the first protection layer 120 can be transmitted more toward the left and right directions of the first protection layer 120 than the second protection layer 130 having a relatively low thermal conductivity. Accordingly, temperature by heat can be evenly distributed over the display panel 100, rather than a specific position has very high temperature by heat emitted from the light emitting device 110.

Thus, problems such as a yellowing phenomenon which means that color of the internal components of the display panel 100 is changed or burn due to the high temperature can be reduced.

Figure 5:
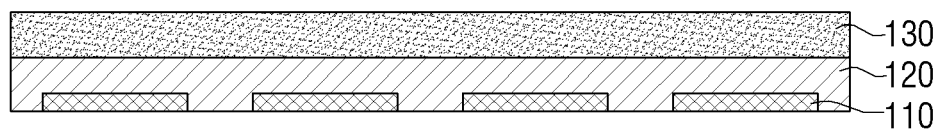
FIGS. 5 and 6 illustrate a protection layer according to another exemplary embodiment.
Figure 6:
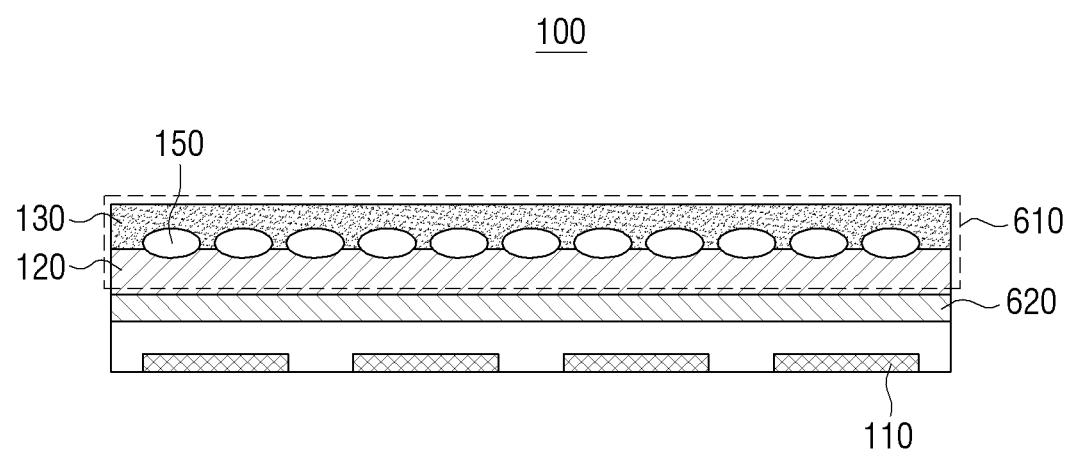

FIGS. 5 and 6 illustrate a protection layer according to another exemplary embodiment 이다.

According to FIG. 5, the transparent layer 140 including the transparent materials 150 may not be included between the first protection layer 120 and the second protection layer 130.

According to an embodiment of the present disclosure, when at least one of the first protection layer 120 and the second protection layer 130 uses a tri-acetyl-cellulose (TAC) type film, the transparent layer 140 may not be provided. Since the TAC film can block ultraviolet rays and infrared rays, the transparent layer 140 for blocking ultraviolet rays and infrared rays may not be separately provided.

According to another embodiment, the transparent layer 140 may be disposed within at least one of the first protection layer 120 and the second protection layer 130.

According to another embodiment, the transparent layer 140 may be a UV reflected coating layer that transmits visible rays and reflects ultraviolet rays. Alternatively, the transparent layer 140 may be a white phosphor coating layer that transmits visible rays and converts ultraviolet rays to visible rays and transmits the visible rays.

According to FIG. 6, a protection layer 610 including the transparent layer 140 that includes the first protection layer 120, the second protection layer 130, and the transparent materials 150 may be disposed on a position that is apart from the light emitting device 110.

Specifically, the protection layer 610 may be disposed on the glass substrate 620 disposed on the upper portion of the light emitting device 110. Here, the glass substrate 620 may be implemented as a liquid crystal display (LCD), but is not limited thereto.

The protection layer 610 may be provided on a display panel for outdoor electronic display.

According to another embodiment, only the transparent layer 140 may be included in the protection layer 610. That is, the protection layer 610 may be disposed on the upper portion of the second protection layer 130, and the transparent layer 140 may be included in the protection layer 610. Here, the protection layer 610 may be in the form of a glass substrate or may be in the form of a film in which the components of the transparent materials 150 are wet-coated.

Figure 7:
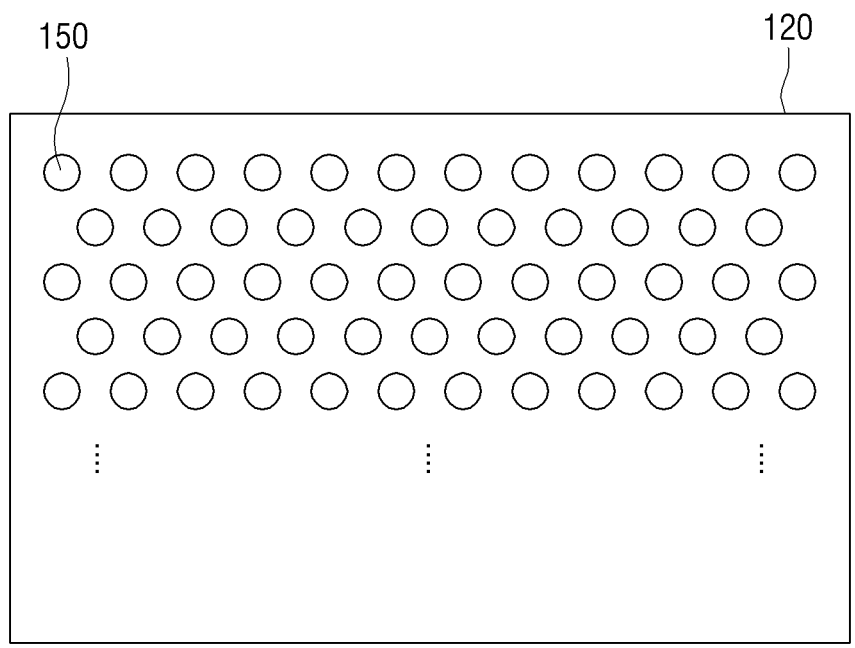
FIG. 7 illustrates a transparent layer according to an exemplary embodiment.

FIG. 7 illustrates a transparent layer according to an exemplary embodiment.

As illustrated in FIG. 7, a plurality of transparent materials 150 may be disposed on an upper portion of the first protection layer 120 in a predetermined interval.

Here, the transparent materials 150 may transmit visible rays, and block ultraviolet rays and infrared rays. Specifically, the transparent materials 150 may be a substance that absorbs or reflects ultraviolet rays and infrared rays.

The transparent materials 150 may be at least one of antimony tin oxide (ATO) and indium tin oxide (ITO).

The transparent materials 150 may be fixed to the surface of the first protection layer 120 that is diffusely reflected. Specifically, the transparent materials 150 can be stably fixed on the surface of the first protection layer 120 because the surface area of the first protection layer 120 is diffusely reflected, causing the area of the surface to be wide.

FIG. 8 illustrates a manufacturing process of a display panel according to an exemplary embodiment.

Figure 8A:
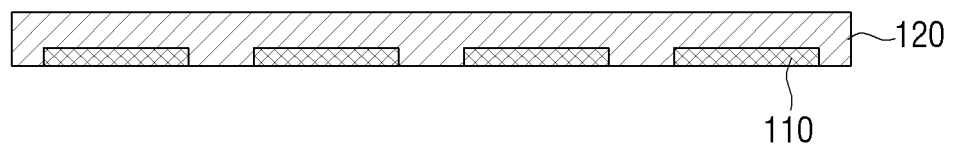
FIGS. 8A, 8B, and 8C illustrates a manufacturing process of a display panel according to an exemplary embodiment.

First, as shown in FIG. 8A, the light emitting device 110 may be provided, and the first protection layer 120 having a surface which is diffusely reflected may be formed on the upper side of the light emitting device 110. The surface of the first protection layer 120 may be coated with a prism sheet. Here, the light emitting device 110 may be an LED.

For example, after the first protection layer 120 is formed on the upper portion of the light emitting device 110, the first protection layer 120 which is diffusely reflected may be formed on the upper portion of the light emitting device 110.

Figure 8B:
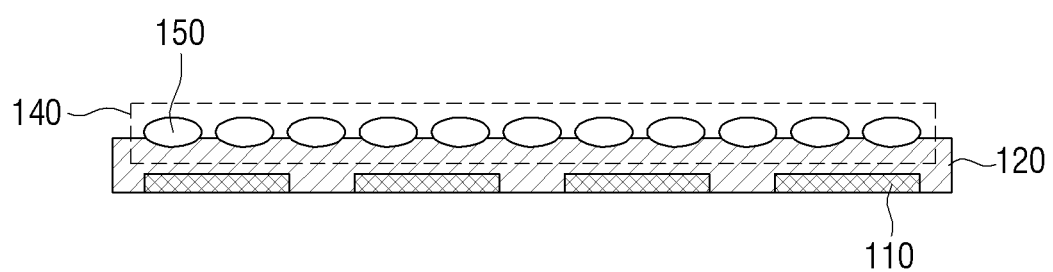

As illustrated in FIG. 8B, the transparent layer 140 in which the transparent materials 150 are disposed to be apart from each other in a predetermined interval on a surface of the first protection layer 120, which is diffusely reflected, can be formed. Here, the transparent materials 150 may be at least one of ATO (Antimony Tin Oxide (ATO) and Indium Tin Oxide (ITO) as a material that transmits visible rays and absorbs or reflects ultraviolet and infrared rays. However, the present disclosure is not limited thereto, and the transparent layer 140 may be formed in a single film form.

Figure 8C:
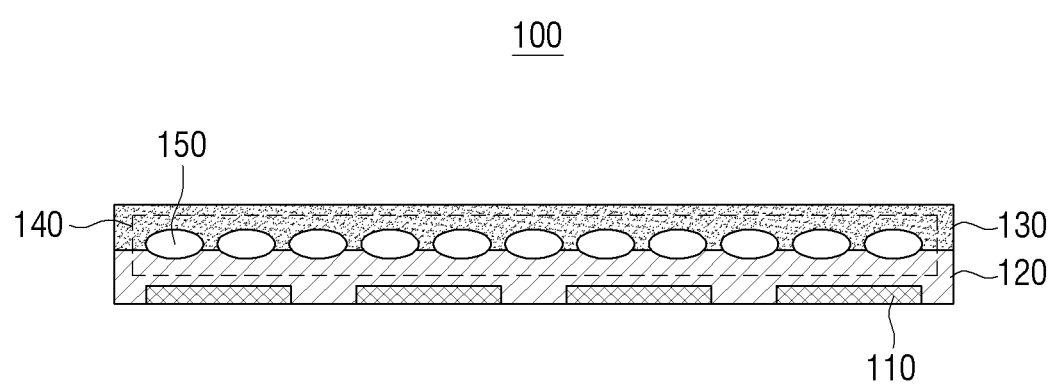

Next, as shown in FIG. 8C, the second protection layer 130 may be formed on the first protection layer 120, the surface of which is treated with at least one of diffuse reflection and anti-reflection. The surface of the second protection layer 130 may be coated with a hydrophilic material or a hydrophobic material For example, after the second protection layer 130 is formed on the upper portion of the first protection layer 120, the second protection layer 130 which is treated with at least one of diffuse reflection and anti-reflection may be formed on the upper portion of the first protection layer 120.

The first protection layer 120 and the second protection layer 130 may be provided with a material that the thermal conductivity of the second protection layer 130 is lower than the thermal conductivity of the first protection layer 120 and the hardness of the second protection layer 130 is greater than the hardness of the first protection layer 120. For example, an ethylene-vinyl acetate (EVA) material may be used for the first protection layer 120 and a polyethylene terephthalate (PET) material may be used for the second protection layer 130. However, the present disclosure is not limited thereto.

Figure 9:
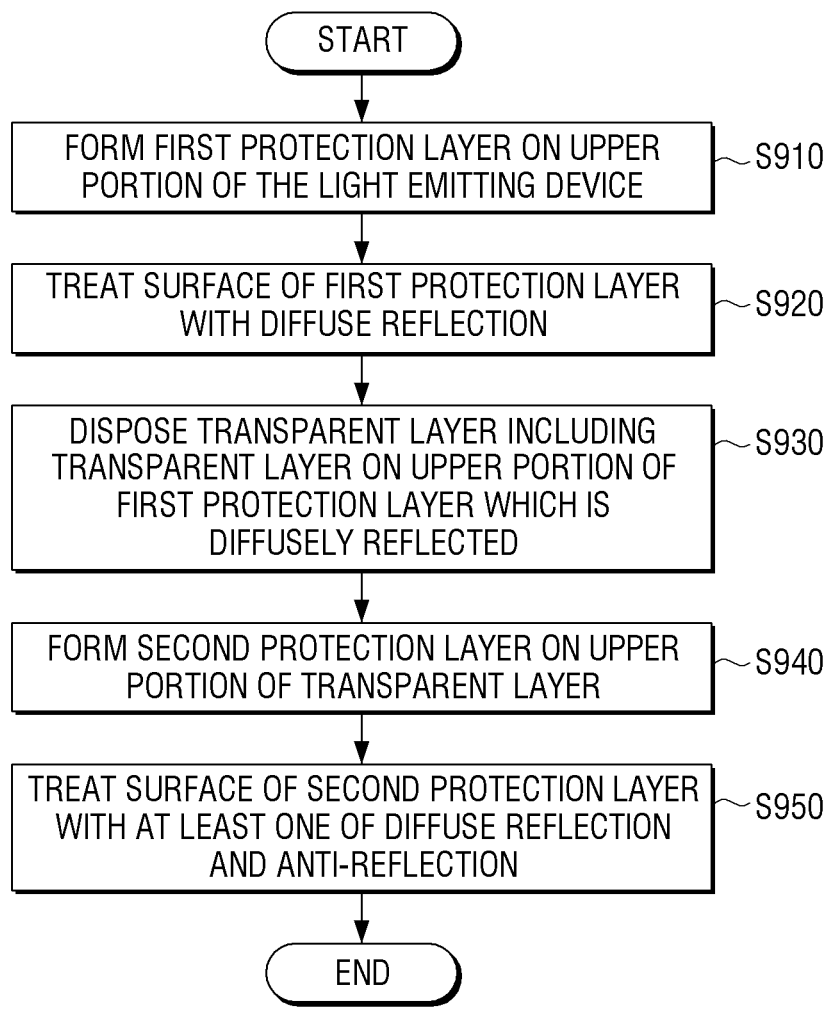
FIG. 9 is a flowchart to describe a method for manufacturing a display panel according to an exemplary embodiment.

FIG. 9 is a flowchart to describe a method for manufacturing a display panel according to an exemplary embodiment.

First, the first protection layer 120 may be formed on the upper portion of the light emitting device 110 in step S910. Here, the thermal conductivity of the first protection layer 120 may be greater than a predetermined value, and the thermal conductivity of the second protection layer 130 may be less than a predetermined value. Further, the light emitting device 110 may be a light emitting diode (LED) element.

The surface of the first protection layer 120 can be treated with diffuse reflection in step S920. Specifically, the surface of the first protection layer 120 may be coated with a prism sheet.

A transparent layer containing the transparent materials 150 may be disposed on the first protection layer 120 which is diffusely reflected in step S930.

In the step of disposing the transparent layer, transparent materials may be spaced apart at a predetermined interval or a film layer in which transparent materials are wet-coated may be disposed.

Here, the transparent materials 150 may be at least one of Antimony Tin Oxide (ATO) and Indium Tin Oxide (ITO). Further, the transparent materials 150 may be fixed to the surface of the first protection layer 120 that is diffusely reflected.

The second protection layer 130 may be formed on an upper portion of the first protection layer 120 in step S940. The first protection layer 120 may be less than a predetermined hardness and the second protection layer 130 may be greater than or equal to a predetermined hardness. Here, the predetermined hardness may be HB 4.

The surface of the second protection layer 130 can be treated as at least one of diffuse reflection and anti-reflection in step S950.

In addition, the surface of the second protection layer 130 may be coated with a hydrophilic material or a hydrophobic material.

Meanwhile, computer instructions for performing the processing operations according to various embodiments of the present disclosure described above may be stored in a non-transitory computer-readable medium. Computer instructions stored on such non-volatile computer-readable media can cause a particular device to perform processing operations according to various embodiments described above when executed by a processor.

The non-transitory computer readable medium refers to a medium that stores data semi-permanently, and is readable by an apparatus. Specifically, the above-described various applications or programs may be stored in the non-transitory computer readable medium such as a compact disc (CD), a digital versatile disk (DVD), a hard disk, a Blu-ray disk, a universal serial bus (USB), a memory card, a ROM or etc., and may be provided.

The foregoing example embodiments and advantages are merely examples and are not to be construed as limiting. The present teaching can be readily applied to other types of apparatuses. Also, the description of the example embodiments is intended to be illustrative, and not to limit the scope of the claims, and many alternatives, modifications, and variations will be apparent to those skilled in the art.

The invention claimed is:

1. A display panel comprising:
   a light emitting device;
   a first protection layer which is disposed on an upper portion of the light emitting device, and of which surface is treated for diffuse reflection;
   a second protection layer which is disposed on an upper portion of the first protection layer, and of which surface is treated for at least one of diffuse reflection and anti-reflection; and
   a transparent layer which includes transparent materials that transmit visible rays, and absorb or reflect ultraviolet rays and infrared rays,
   wherein the transparent materials are spaced apart from each other with a predetermined interval and fixed on the surface of the first protection layer between the first protection layer and the second protection layer.

2. The display panel of claim 1, wherein the transparent layer is a film layer in which the transparent materials are wet-coated.

3. The display panel of claim 1, wherein the transparent materials are mixed with at least one of the first protection layer and the second protection layer.

4. The display panel of claim 1, wherein thermal conductivity of the first protection layer is greater than or equal to a predetermined value, and thermal conductivity of the second protection layer is less than the predetermined value.

5. The display panel of claim 4, wherein hardness of the first protection layer is less than a predetermined value, and hardness of the second protection layer is greater than or equal to the predetermined value.

6. The display panel of claim 1, wherein the surface of the first protection layer is treated for at least one of diffuse reflection and anti-reflection in that the surface of the first protection layer is coated with a prism sheet.

7. The display panel of claim 1, wherein the surface of the second protection layer is coated with a hydrophilic material or a hydrophobic material.

8. The display panel of claim 1, wherein the light emitting device is a light emitting diode (LED).

9. The display panel of claim 1, wherein the transparent materials are at least one of antimony tin oxide (ATO) and indium tin oxide (ITO).

10. A method for manufacturing a display panel, the method comprising:
    forming a first protection layer on an upper portion of a light emitting device;
    treating a surface of the first protection layer for diffuse reflection;
    disposing a transparent layer including transparent materials on an upper portion of the first protection layer treated for the diffuse reflection;
    forming a second protection layer on an upper portion of the transparent layer; and
    treating a surface of the second protection layer for at least one of diffuse reflection and anti-reflection,
    wherein the transparent materials transmit visible rays, and absorb or reflect ultraviolet rays and infrared rays,
    wherein the disposing the transparent layer comprises disposing the transparent materials spaced apart with a predetermined interval and fixing the transparent materials on the surface of the first protection layer between the first protection layer and the second protection layer.

11. The method of claim 10, wherein the disposing a transparent layer comprises disposing a film layer in which the transparent materials are wet-coated.

12. The method of claim 10, wherein thermal conductivity of the first protection layer is greater than or equal to a predetermined value, and thermal conductivity of the second protection layer is less than the predetermined value.

* * * * *